US008017428B2

(12) United States Patent
Laudisio et al.

(10) Patent No.: US 8,017,428 B2
(45) Date of Patent: Sep. 13, 2011

(54) PROCESS OF FORMING A SILICON SOLAR CELL

(75) Inventors: Giovanna Laudisio, Bristol (GB); Kurt Richard Mikeska, Hockessin, DE (US); Alistair Graeme Prince, Bedminster (GB); Richard John Sheffield Young, Somerset (GB)

(73) Assignee: E. I. du Pont de Nemours and Company, Wilmington, DE (US)

( * ) Notice: Subject to any disclaimer, the term of this patent is extended or adjusted under 35 U.S.C. 154(b) by 39 days.

(21) Appl. No.: 12/481,672

(22) Filed: Jun. 10, 2009

(65) Prior Publication Data

US 2010/0317143 A1    Dec. 16, 2010

(51) Int. Cl.
*H01L 31/18* (2006.01)
*H01L 31/0216* (2006.01)

(52) U.S. Cl. .......... 438/72; 257/E31.119; 252/508; 252/512

(58) Field of Classification Search .......... 438/72; 257/E31.119; 252/508, 512, 514; 136/252, 136/256, 261
See application file for complete search history.

(56) References Cited

U.S. PATENT DOCUMENTS

| 2007/0079868 | A1* | 4/2007 | Rose et al. | 136/252 |
| 2009/0056798 | A1* | 3/2009 | Merchant et al. | 136/256 |
| 2009/0223563 | A1* | 9/2009 | Lai et al. | 136/261 |
| 2009/0283141 | A1* | 11/2009 | Bentzen et al. | 136/256 |

FOREIGN PATENT DOCUMENTS

| EP | 1775776 A1 | 4/2007 |
| JP | 2004-152827 A | 5/2004 |
| WO | 2009/032429 A1 | 3/2009 |

OTHER PUBLICATIONS

International Search Report Dated Jul. 27, 2010 For International Application No. PCT/US2009/046893.

* cited by examiner

*Primary Examiner* — Matthew Smith
*Assistant Examiner* — Christine Enad

(57) ABSTRACT

A process for the production of a silicon solar cell comprising application and firing of an aluminum paste which comprises magnesium oxide and/or magnesium compounds capable of forming magnesium oxide on firing on the back-side of a silicon wafer provided with a silicon nitride antireflective coating on its front-side and being contaminated with silicon nitride on its back-side, and firing the aluminum paste after its application.

6 Claims, 2 Drawing Sheets

PROCESS OF FORMING A SILICON SOLAR CELL

FIELD OF THE INVENTION

The present invention is directed to a process of forming a p-type aluminum back electrode of a silicon solar cell, i.e., a process of forming a silicon solar cell.

TECHNICAL BACKGROUND OF THE INVENTION

A conventional solar cell structure with a p-type base has a negative electrode that is typically on the front-side ("sun" side) of the cell and a positive electrode on the back. It is well known that radiation of an appropriate wavelength falling on a p-n junction of a semiconductor body serves as a source of external energy to generate electron-hole pairs. The potential difference that exists at a p-n junction, causes holes and electrons to move across the junction in opposite directions, thereby giving rise to flow of an electric current that is capable of delivering power to an external circuit. Most solar cells are in the form of a silicon wafer that has been metallized, i.e., provided with metal contacts which are electrically conductive.

During the formation of a silicon solar cell, an aluminum paste is generally screen printed and dried on the back-side of the silicon wafer. The wafer is then fired at a temperature above the melting point of aluminum to form an aluminum-silicon melt, subsequently, during the cooling phase, an epitaxially grown layer of silicon is formed that is doped with aluminum. This layer is generally called the back surface field (BSF) layer, and helps to improve the energy conversion efficiency of the solar cell.

Most electric power-generating solar cells currently used are silicon solar cells. Process flow in mass production is generally aimed at achieving maximum simplification and minimizing manufacturing costs. Electrodes in particular are made by using a method such as screen printing from a metal paste.

An example of this method of production is described below in conjunction with FIG. 1. FIG. 1A shows a p-type silicon substrate, 10.

In FIG. 1B, an n-type diffusion layer, 20, of the reverse conductivity type is formed by the thermal diffusion of phosphorus (P) or the like. Phosphorus oxychloride ($POCl_3$) is commonly used as the gaseous phosphorus diffusion source; other liquid sources are phosphoric acid and the like. In the absence of any particular modification, the diffusion layer, 20, is formed over the entire surface of the silicon substrate, 10. The p-n junction is formed where the concentration of the p-type dopant equals the concentration of the n-type dopant; conventional cells that have the p-n junction close to the sun side, have a junction depth between 0.05 and 0.5 μm.

After formation of this diffusion layer excess surface glass is removed from the rest of the surfaces by etching by an acid such as hydrofluoric acid.

Next, an antireflective coating (ARC), 30, is formed on the silicon wafer's front-side n-type diffusion layer, 20, to a thickness of between 0.05 and 0.1 μm in the manner shown in FIG. 1D by a process, such as, for example, sputtering or CVD (chemical vapor deposition), for example, LPCVD (low pressure CVD) or PECVD (plasma enhanced CVD).

As shown in FIG. 1E, a front-side silver paste (front electrode-forming silver paste), 500, for the front electrode is screen printed and then dried over the antireflective coating, 30. In addition, a back-side silver or silver/aluminum paste, 70, and an aluminum paste, 60, are then screen printed (or some other application method) and successively dried on the back-side of the substrate. Normally, the back-side silver or silver/aluminum paste is screen printed onto the silicon first as two parallel strips (busbars) or as rectangles (tabs) ready for soldering interconnection strings (presoldered copper ribbons), the aluminum paste is then printed in the bare areas with a slight overlap over the back-side silver or silver/aluminum. In some cases, the silver or silver/aluminum paste is printed after the aluminum paste has been printed. Firing is then typically carried out in a belt furnace for a period of 1 to 5 minutes with the wafer reaching a peak temperature in the range of 700 to 900° C. The front and back electrodes can be fired sequentially or cofired.

Consequently, as shown in FIG. 1F, molten aluminum from the paste dissolves the silicon during the firing process and then on cooling forms a eutectic layer that epitaxially grows from the silicon base, 10, forming a p+ layer, 40, containing a high concentration of aluminum dopant. This layer is generally called the back surface field (BSF) layer, and helps to improve the energy conversion efficiency of the solar cell. A thin layer of aluminum is generally present at the surface of this epitaxial layer.

The aluminum paste is transformed by firing from a dried state, 60, to an aluminum back electrode, 61. The back-side silver or silver/aluminum paste, 70, is fired at the same time, becoming a silver or silver/aluminum back electrode, 71. During firing, the boundary between the back-side aluminum and the back-side silver or silver/aluminum assumes an alloy state, and is connected electrically as well. The aluminum electrode accounts for most areas of the back electrode, owing in part to the need to form a p+ layer, 40. Since soldering to an aluminum electrode is impossible, a silver or silver/aluminum back electrode is formed over portions of the back-side (often as 2 to 6 mm wide busbars) as an electrode for interconnecting solar cells by means of pre-soldered copper ribbon or the like. In addition, the front-side silver paste, 500, sinters and penetrates through the antireflective coating, 30, during firing, and is thereby able to electrically contact the n-type layer, 20. This type of process is generally called "firing through". This fired through state is apparent in layer 501 of FIG. 1F.

As already mentioned above, the silicon solar cells comprise an antireflective coating which is typically applied by a CVD process, in particular LPCVD. Antireflective coatings of today's silicon solar cells are typically in the form of a silicon nitride (SiNx) layer. If no special effort is provided in terms of using special back-side covering means during formation of said silicon nitride antireflective coating by CVD on the front-side of the silicon wafers, it is inevitable that some unwanted silicon nitride is also deposited on the back-side of the silicon wafers. Such visually perceptible silicon nitride overspill takes the form of a seam running along the edges on the back-side of the silicon wafers and it covers, for example, 5 to 20 area % of the back-side of the silicon wafers. Such silicon nitride back-side contamination weakens not only adhesion between the back-side of the silicon wafer and the aluminum back electrode obtained after firing but also impairs the electrical performance (electrical yield) of the finished silicon solar cells compared to silicon solar cells produced under employment of the aforementioned special back-side covering, i.e., silicon solar cells exhibiting no silicon nitride back-side contamination. Good adhesion between the back-side of the silicon wafer and the aluminum back electrode obtained after firing is important with a view to a long service-life of the silicon solar cell.

Aluminum pastes suitable for the production of back-side electrodes of silicon solar cells and comprising magnesium oxide are known from JP-A-2004152827.

SUMMARY OF THE INVENTION

It has now been found that the electrical performance of a silicon solar cell made from a silicon wafer provided with a silicon nitride antireflective coating on its front-side and contaminated with silicon nitride overspill on its back-side can be improved when an aluminum paste comprising certain Mg-containing additives is used for the production of the silicon solar cell's back-side electrode. Moreover, adhesion between the back-side of the silicon wafer and the aluminum back electrode obtained after firing can be improved.

Accordingly, the present invention relates to a process for the production of a silicon solar cell comprising the steps:
(i) applying an aluminum paste on the back-side of a silicon wafer having a p-type region, an n-type region and a p-n junction, and being provided with a silicon nitride antireflective coating on its front-side and contaminated with silicon nitride on its back-side, and
(ii) firing the surface provided with the aluminum paste, whereby the wafer reaches a peak temperature of 700 to 900° C.,
wherein the aluminum paste comprises particulate aluminum, at least one Mg-containing additive selected from the group consisting of magnesium oxide, magnesium compounds capable of forming magnesium oxide on firing in step (ii) and any combinations thereof, and an organic vehicle (organic medium) comprising organic solvent(s).

The silicon solar cells obtained by the process of the present invention are distinguished by enhanced electrical performance (electrical yield) compared to silicon solar cells produced under the same conditions but with the use of an aluminum paste free of such Mg-containing additive. Also, adhesion between the aluminum back electrode and the back-side of the silicon wafers comprised by the silicon solar cells can be improved. It is advantageous, that there is no need to employ any special back-side covering when producing the silicon nitride antireflective coating on the front-side of the silicon wafers.

The present invention relates also to a process of improving the electrical performance (electrical yield) of a silicon solar cell comprising the steps:
(i') providing a silicon wafer having a p-type region, an n-type region and a p-n junction, and being provided with a silicon nitride antireflective coating on its front-side and contaminated with silicon nitride on its back-side,
(i) applying an aluminum paste on the back-side of the silicon wafer, and
(ii) firing the surface provided with the aluminum paste, whereby the wafer reaches a peak temperature of 700 to 900° C.,
wherein the aluminum paste comprises particulate aluminum, at least one Mg-containing additive selected from the group consisting of magnesium oxide, magnesium compounds capable of forming magnesium oxide on firing in step (ii) and any combinations thereof, and an organic vehicle comprising organic solvent(s).

Figure 1A:
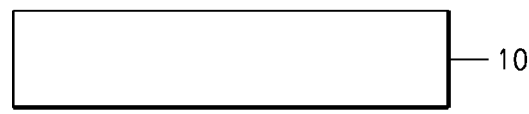
FIG. 1 is a process flow diagram illustrating exemplary the fabrication of a silicon solar cell comprising a silicon wafer provided with a silicon nitride antireflective coating.
Figure 1B:
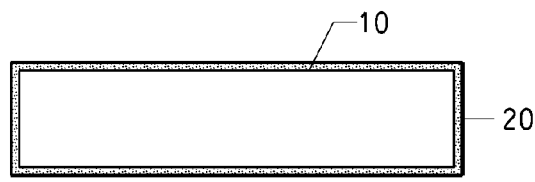
Figure 1C:
Figure 1D:
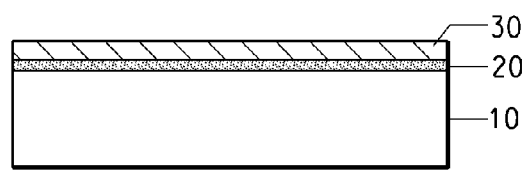
Figure 1E:
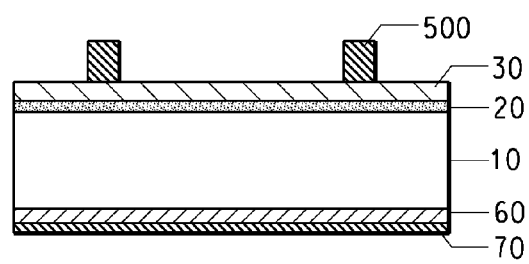
Figure 1F:
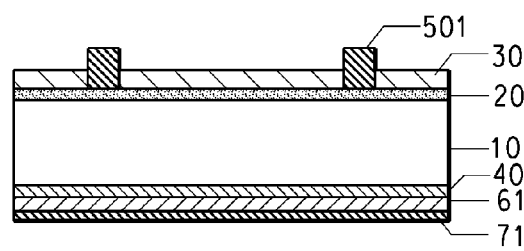

Reference numerals shown in FIG. 1 are explained below.
10: p-type silicon wafer
20: n-type diffusion layer
30: SiNx antireflective coating
40: p+ layer (back surface field, BSF)
60: aluminum paste formed on back-side
61: aluminum back electrode (obtained by firing back-side aluminum paste)
70: silver or silver/aluminum paste formed on back-side
71: silver or silver/aluminum back electrode (obtained by firing back-side silver or silver/aluminum paste)
500: silver paste formed on front-side
501: silver front electrode (obtained by firing front-side silver paste)

FIGS. 2 A-D explain the silicon solar cell manufacturing process of the present invention. Reference numerals shown in FIG. 2 are explained below.
102 silicon substrate (silicon wafer provided with a silicon nitride antireflective coating on its front-side and having a back-side contaminated with silicon nitride)
104 light-receiving surface side electrode
106 paste composition for a first electrode
108 electroconductive paste for a second electrode
110 first electrode
112 second electrode

DETAILED DESCRIPTION OF THE INVENTION

In step (i') of the process of the present invention a silicon wafer having a p-type region, an n-type region and a p-n junction, and being provided with a silicon nitride antireflective coating on its front-side and contaminated with silicon nitride on its back-side is provided. Such silicon wafers and the production thereof are known to the person skilled in the art and do not require unnecessary repetitive explanations; therefore reference is made to the section "Technical Background of the Invention". The silicon wafers may comprise monocrystalline or polycrystalline silicon and they may have an area in the range of, for example, 100 to 250 cm² and a thickness of, for example, 180 to 300 μm.

In step (i) of the processes of the present invention an aluminum paste is applied on the back-side of a silicon wafer having a p-type region, an n-type region and a p-n junction, and being provided with a silicon nitride antireflective coating on its front-side and contaminated with silicon nitride overspill on its back-side.

The aluminum paste employed in step (i) of the processes of the present invention comprises: particulate aluminum, at least one Mg-containing additive selected from magnesium oxide and/or magnesium compounds capable of forming magnesium oxide on firing in step (ii), an organic vehicle and, in an embodiment, also one or more glass frit compositions.

The particulate aluminum may be comprised of aluminum or an aluminum alloy with one or more other metals like, for example, zinc, tin, silver and magnesium. In case of aluminum alloys the aluminum content is, for example, 99.7 to below 100 wt. %. The particulate aluminum may comprise aluminum particles in various shapes, for example, aluminum flakes, spherical-shaped aluminum powder, nodular-shaped (irregular-shaped) aluminum powder or any combinations thereof. Particulate aluminum, in an embodiment, is in the form of aluminum powder. The aluminum powder exhibits an average particle size of, for example, 4 to 10 μm. The particulate aluminum may be present in the aluminum pastes in a proportion of 50 to 80 wt. %, or, in an embodiment, 70 to 75 wt. %, based on total aluminum paste composition.

In the present description and the claims the term "average particle size" is used. It shall mean the average particle size (mean particle diameter, d50) determined by means of laser scattering.

All statements made in the present description and the claims in relation to average particle sizes relate to average particle sizes of the relevant materials as are present in the aluminum paste composition.

The particulate aluminum present in the aluminum pastes may be accompanied by other particulate metal(s) such as, for example, silver or silver alloy powders. The proportion of such other particulate metal(s) is, for example, 0 to 10 wt. %, based on the total of particulate aluminum plus particulate metal(s).

The aluminum paste comprises at least one Mg-containing additive selected from magnesium oxide and/or magnesium compounds capable of forming magnesium oxide on firing in step (ii). The one, two or more Mg-containing additives may be present in a total proportion corresponding to a total magnesium contribution of 0.1 to 5 wt. %, or, in an embodiment, 0.2 to 1 wt. %, based on total aluminum paste composition.

In an embodiment, magnesium oxide is contained in the aluminum paste as Mg-containing additive. In a further embodiment, it is contained as the only Mg-containing additive. The magnesium oxide may have an average particle size in the range of, for example, 10 nm to 10 μm, or, in an embodiment, 40 nm to 5 μm.

If magnesium oxide itself is comprised, it must not be confused with magnesium oxide that may form a constituent of one or more glass frits which may optionally be contained in the aluminum paste.

The magnesium compounds capable of forming magnesium oxide on firing in step (ii) may be solid compounds which, in case they are insoluble in the organic vehicle of the aluminum paste, are present in particulate form in the aluminum paste. In the latter case they may have an average particle size of, for example, 10 nm to 10 μm, or, in an embodiment, 40 nm to 5 μm.

Examples of magnesium compounds capable of forming magnesium oxide on firing in step (ii) which may be contained in the aluminum paste comprise certain thermodecomposable inorganic magnesium compounds, namely inorganic magnesium compounds which decompose into magnesium oxide and gaseous decomposition products under the action of heat. Examples of such thermodecomposable inorganic magnesium compounds include magnesium hydroxide, magnesium carbonate and magnesium nitrate. Further examples of magnesium compounds capable of forming magnesium oxide on firing in step (ii) which may be contained in the aluminum paste comprise magnesium-organic compounds. The term "magnesium-organic compounds" means magnesium compounds comprising at least one organic moiety in the molecule. The magnesium-organic compounds are stable or essentially stable, for example, in the presence of atmospheric oxygen or air humidity, under the conditions prevailing during preparation, storage and application of the aluminum paste. The same is true under the application conditions, in particular, under those conditions prevailing during screen printing of the aluminum paste onto the silicon nitride contaminated back-side of the silicon wafer. However, during firing of the aluminum paste the organic portion of the magnesium-organic compounds will or will essentially be removed, for example, burned and/or carbonized. The magnesium-organic compounds may be added as such or as a solution in organic solvent(s) during preparation of the aluminum pastes. In an embodiment, the magnesium-organic compounds comprise magnesium-organic salt compounds.

Examples of suitable magnesium-organic salt compounds include in particular magnesium resinates (magnesium salts of acidic resins, in particular, resins with carboxyl groups) and magnesium carboxylates (magnesium carboxylic acid salts), such as, magnesium acetate, magnesium octoate, magnesium neodecanoate, magnesium oleate and magnesium stearate.

In an embodiment, the aluminum paste comprises at least one glass frit composition as an inorganic binder. The glass frit compositions may contain PbO; in an embodiment, the glass frit compositions may be leadfree. The glass frit compositions may comprise those which upon firing undergo recrystallization or phase separation and liberate a frit with a separated phase that has a lower softening point than the original softening point.

The (original) softening point (glass transition temperature, determined by differential thermal analysis DTA at a heating rate of 10 K/min) of the glass frit compositions may be in the range of 325 to 600° C.

The glass frits exhibit average particle sizes (mean particle diameters) determined by means of laser scattering of, for example, 2 to 20 μm. In case of an aluminum paste comprising glass-frit(s) the glass frit(s) content may be 0.01 to 5 wt. %, or, in an embodiment, 0.1 to 2 wt. %, or, in a further embodiment, 0.2 to 1.25 wt. %, based on total aluminum paste composition.

Some of the glass frits useful in the aluminum paste are conventional in the art. Some examples include borosilicate and aluminosilicate glasses. Examples further include combinations of oxides, such as: $B_2O_3$, $SiO_2$, $Al_2O_3$, CdO, CaO, BaO, ZnO, $Na_2O$, $Li_2O$, PbO, and $ZrO_2$ which may be used independently or in combination to form glass binders.

The conventional glass frits may be the borosilicate frits, such as lead borosilicate frit, bismuth, cadmium, barium, calcium, or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compounds that will yield the desired oxides under the usual conditions of frit production. For example, boric oxide will be obtained from boric acid, silicon dioxide will be produced from flint, barium oxide will be produced from barium carbonate, etc.

The glass may be milled in a ball mill with water or inert low viscosity, low boiling point organic liquid to reduce the particle size of the frit and to obtain a frit of substantially uniform size. It may then be settled in water or said organic liquid to separate fines and the supernatant fluid containing the fines may be removed. Other methods of classification may be used as well.

The glasses are prepared by conventional glassmaking techniques, by mixing the desired components in the desired proportions and heating the mixture to form a melt. As is well known in the art, heating may be conducted to a peak temperature and for a time such that the melt becomes entirely liquid and homogeneous.

The aluminum paste comprises an organic vehicle. A wide variety of inert viscous materials can be used as organic vehicle. The organic vehicle may be one in which the particulate constituents (particulate aluminum, particulate and insoluble Mg-containing additive(s), glass frit if any) are dispersible with an adequate degree of stability. The properties, in particular, the rheological properties, of the organic vehicle may be such that they lend good application properties to the aluminum paste composition, including: stable dispersion of insoluble solids, appropriate viscosity and thixotropy for application, in particular, for screen printing, appropriate wettability of the silicon wafer substrate and the paste solids, a good drying rate, and good firing properties. The organic vehicle used in the aluminum paste may be a nonaqueous inert liquid. The organic vehicle may be an organic solvent or an organic solvent mixture; in an embodiment, the organic vehicle may be a solution of organic polymer(s) in organic solvent(s). In an embodiment, the polymer used for this purpose may be ethyl cellulose. Other examples of polymers which may be used alone or in combination include ethylhydroxyethyl cellulose, wood rosin, phenolic resins and poly(meth)acrylates of lower alcohols. Examples of suitable organic solvents comprise ester alcohols and terpenes such as alpha- or beta-terpineol or mixtures thereof with other solvents such as kerosene, dibutylphthalate, diethylene glycol butyl ether, diethylene glycol butyl ether acetate, hexylene glycol and high boiling alcohols. In addition, volatile organic solvents for promoting rapid hardening after application of the aluminum paste on the back-side of the silicon wafer can be included in the organic vehicle. Various combinations of these and other solvents may be formulated to obtain the viscosity and volatility requirements desired.

The organic solvent content in the aluminum paste may be in the range of 5 to 25 wt. %, or, in an embodiment, 10 to 20 wt. %, based on total aluminum paste composition.

The organic polymer(s) may be present in the organic vehicle in a proportion in the range of 0 to 20 wt. %, or, in an embodiment, 5 to 10 wt. %, based on total aluminum paste composition.

The aluminum paste may comprise one or more organic additives, for example, surfactants, thickeners, rheology modifiers and stabilizers. The organic additive(s) may be part of the organic vehicle. However, it is also possible to add the organic additive(s) separately when preparing the aluminum paste. The organic additive(s) may be present in the aluminum paste in a total proportion of, for example, 0 to 10 wt. %, based on total aluminum paste composition.

The organic vehicle content in the aluminum pastes may be dependent on the method of applying the paste and the kind of organic vehicle used, and it can vary. In an embodiment, it may be from 20 to 45 wt. %, or, in an embodiment, it may be in the range of 22 to 35 wt. %, based on total aluminum paste composition. The number of 20 to 45 wt. % includes organic solvent(s), possible organic polymer(s) and possible organic additive(s).

In an embodiment, the aluminum paste comprises
70 to 75 wt. % of particulate aluminum,
Mg-containing additive(s) in a total proportion corresponding to a total magnesium contribution of 0.2 to 1 wt. %,
0.2 to 1.25 wt. % of one or more glass frits,
10 to 20 wt. % of one or more organic solvents,
5 to 10 wt. % of one or more organic polymers, and
0 to 5 wt. % of one or more organic additives.

The aluminum paste is a viscous composition, which may be prepared by mechanically mixing the particulate aluminum, the Mg-containing additive(s) and the optional glass frit composition(s) with the organic vehicle. In an embodiment, the manufacturing method power mixing, a dispersion technique that is equivalent to the traditional roll milling, may be used; roll milling or other mixing technique can also be used.

The aluminum paste can be used as such or may be diluted, for example, by the addition of additional organic solvent(s); accordingly, the weight percentage of all the other constituents of the aluminum paste may be decreased.

In step (i) of the processes according to the invention the aluminum paste is applied on the silicon nitride contaminated back-side of the silicon wafer, i.e., to those surface portions of the back-side which are or will not be covered by other back-side metal pastes like, in particular, back-side silver or silver/aluminum pastes. The aluminum paste may be applied to a dry film thickness of, for example, 15 to 60 µm. The method of aluminum paste application may be printing, for example, silicone pad printing or, in an embodiment, screen printing. The application viscosity of the aluminum paste may be 20 to 200 Pa·s when it is measured at a spindle speed of 10 rpm and 25° C. by a utility cup using a Brookfield HBT viscometer and #14 spindle.

After application of the aluminum paste to the silicon nitride contaminated back-side of the silicon wafer it may be dried, for example, for a period of 1 to 100 minutes with the wafer reaching a peak temperature in the range of 100 to 300° C. Drying can be carried out making use of, for example, belt, rotary or stationary driers, in particular, IR (infrared) belt driers.

After its application or, in an embodiment, after its application and drying, the aluminum paste is fired in step (ii) of the processes according to the invention to form an aluminum back electrode. Firing may be performed, for example, for a period of 1 to 5 minutes with the silicon wafer reaching a peak temperature in the range of 700 to 900° C. Firing can be carried out making use of, for example, single or multi-zone belt furnaces, in particular, multi-zone IR belt furnaces. Firing happens in the presence of oxygen, in particular, in the presence of air. During firing the organic substance including non-volatile organic material and the organic portion not evaporated during the possible drying step may be removed, i.e. burned and/or carbonized, in particular, burned. The organic substance removed during firing includes organic solvent(s), possible organic polymer(s), possible organic additive(s) and the organic moieties of possible magnesium-organic compounds. In case the aluminum paste comprises magnesium compound(s) capable of forming magnesium oxide on firing in step (ii) the magnesium provided by said magnesium compound(s) remains or remains essentially as magnesium oxide after firing. In case the aluminum paste comprises glass frit(s), there may be a further process taking place during firing, namely sintering of the glass frit(s). Firing may be performed as so-called cofiring together with further metal pastes that have been applied to the silicon wafer, i.e., front-side and/or back-side metal pastes which have been applied to form front-side and/or back-side electrodes on the wafer's surfaces during the firing process. An embodiment includes front-side silver pastes and back-side silver or back-side silver/aluminum pastes.

Next, a non-limiting example in which a silicon solar cell is prepared in accordance with the process of the present invention is explained, referring to FIG. 2.

Figure 2A:
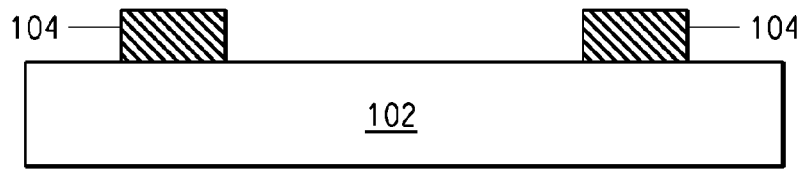
Figure 2B:
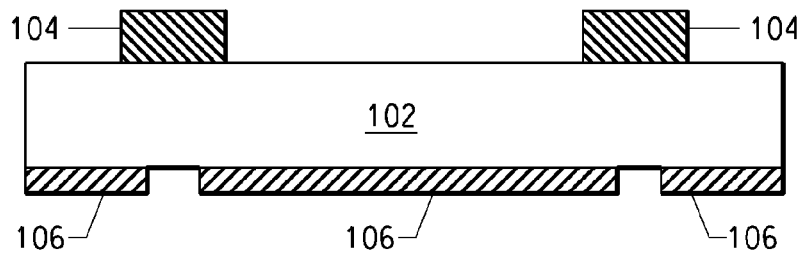
Figure 2C:
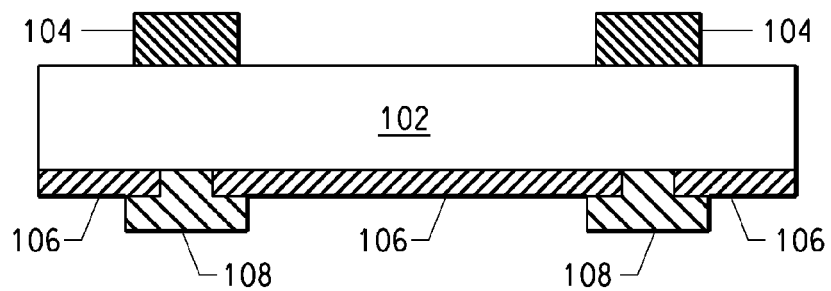

First, a silicon wafer substrate 102 is prepared. On the light-receiving side face (front-side surface) of the silicon wafer provided with the silicon nitride antireflective coating, normally with the p-n junction close to the surface, front-side electrodes (for example, electrodes mainly composed of silver) 104 are installed (FIG. 2A). On the silicon nitride contaminated back-side of the silicon wafer, a silver or silver/aluminum electroconductive paste (for example, PV202 or PV502 or PV583 or PV581, commercially available from E.I. Du Pont de Nemours and Company) is spread to form either busbars or tabs to enable interconnection with other solar cells set in parallel electrical configuration. On the silicon nitride contaminated back-side of the silicon wafer, the aluminum paste comprising the Mg-containing additive(s) and used as a back-side (or p-type contact) electrode for the solar cell, 106 is spread by screen printing using the pattern that enable slight overlap with the silver or silver/aluminum paste referred to above, etc., then dried (FIG. 2B). Drying of the pastes is performed, for example, in an IR belt drier for a period of 1 to 10 minutes with the wafer reaching a peak temperature of 100 to 300° C. Also, the aluminum paste may have a dried film thickness of 15 to 60 μm, and the thickness of the silver or silver/aluminum paste may be 15 to 30 μm. Also, the overlapped part of the aluminum paste and the silver or silver/aluminum paste may be about 0.5 to 2.5 mm.

Figure 2D:
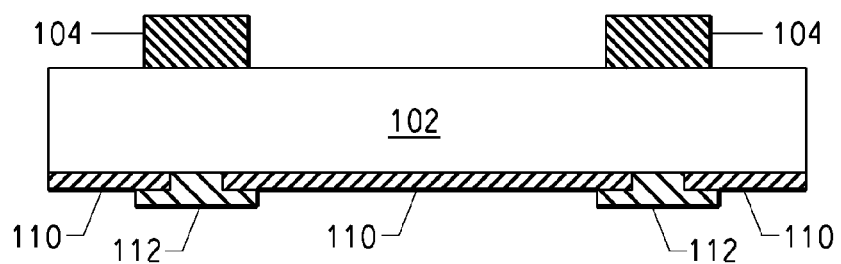

Next, the substrate obtained is fired, for example, in a belt furnace for a period of 1 to 5 minutes with the wafer reaching a peak temperature of 700 to 900° C., so that the desired silicon solar cell is obtained (FIG. 2D). An electrode 110 is formed from the aluminum paste wherein said paste has been fired to remove the organic substance, in case the aluminum paste comprises magnesium compound(s) capable of forming magnesium oxide on firing to form magnesium oxide and, in case the aluminum paste comprises glass frit, to sinter the latter.

The silicon solar cell obtained using the aluminum paste, as shown in FIG. 2D, has electrodes 104 on the light-receiving face (surface) of the silicon substrate 102, aluminum electrodes 110 mainly composed of aluminum and silver or silver/aluminum electrodes 112 mainly composed of silver or silver and aluminum (formed by firing silver or silver/aluminum paste 108), on the back-side.

EXAMPLES

(1) Manufacture of Solar Cell

A solar cell was formed as follows:
(i) On the back face of a Si substrate [200 μm thick multicrystalline silicon wafer of area 243 cm$^2$, p-type (boron) bulk silicon, with an n-type diffused POCl$_3$ emitter, surface texturized with acid, SiNx anti-reflective coating (ARC) on the wafer's emitter applied by CVD, 15 area-% of the silicon wafer's back face covered with an approximately 50 nm thick rectangularly shaped SiNx layer which had artificially been applied by CVD to simulate a SiNx contamination, having a 20 μm thick silver electrode on the front surface (PV145 Ag composition commercially available from E. I. Du Pont de Nemours and Company)] an Ag/Al paste (PV202, an Ag/Al composition commercially available from E. I. Du Pont de Nemours and Company) was printed and dried as 5 mm wide bus bars. Then, an aluminum paste for the back face electrode of a solar cell was screen-printed at a dried film thickness of 30 μm providing overlap of the aluminum film with the Ag/Al busbar for 1 mm at both edges to ensure electrical continuity. The screen-printed aluminum paste was dried before firing.

The example aluminum pastes comprised 72 wt. % air-atomized aluminium powder (average particle size 6 μm), 26 wt. % organic vehicle of polymeric resins and organic solvents, and 0.5 wt. % glass frit. The example aluminum pastes B to C (according to the invention) comprised magnesium oxide (average particle size 8 μm) whereas the control example A aluminum paste (comparative example) comprised no magnesium oxide.

(ii) The printed wafers were then fired in a Centrotherm furnace at a belt speed of 3000 mm/min with zone temperatures defined as zone 1=450° C., zone 2=520° C., zone 3=570° C. and the final zone set at 950° C., thus the wafers reaching a peak temperature of 850° C. After firing, the metallized wafer became a functional photovoltaic device.

Measurement of the electrical performance and fired adhesion in the SiNx contamination zone was undertaken.

(2) Test Procedures

Efficiency

The solar cells formed according to the method described above were placed in a commercial I-V tester (supplied by EETS Ltd.) for the purpose of measuring light conversion efficiencies. The lamp in the I-V tester simulated sunlight of a known intensity (approximately 1000 W/m$^2$) and illuminated the emitter of the cell. The metallizations printed onto the fired cells were subsequently contacted by four electrical probes. The photocurrent (Voc, open circuit voltage; Isc, short circuit current) generated by the solar cells was measured over arrange of resistances to calculate the I-V response curve. Fill Factor (FF) and Efficiency (Eff) values were subsequently derived from the I-V response curve.

Fired Adhesion

In order to measure the cohesive strength of the Al metallizations the amount of material removed from the SiNx contaminated part of the back face of the fired wafer was determined using a peel test. To this end a transparent layer of adhesive tape was applied and subsequently peeled off. The adhesion figures in Table 1 illustrate an increase in the paste's adhesion as with a corresponding increase in the magnesium oxide content of the composition.

Examples A to C cited in Table 1 illustrate the electrical properties of the aluminum pastes as a function of magnesium oxide content in comparison to the standard composition without magnesium oxide (control). The data in Table 1 confirms that the electrical performance of the solar cells made using aluminum pastes according to Examples B and C improve significantly when compared to the solar cell made with the paste according to the control Example A. The adhesion of the Al-BSF thick film layer to the SiNx contaminated area of cell's back face is also shown to improve.

TABLE 1

| Example | wt. % MgO | wt. % glass frit | Voc (mV) | Isc (A) | Eff (%) | FF (%) | Adhesion (area %)* |
|---|---|---|---|---|---|---|---|
| A (control) | 0.0 | 0.5 | 589.9 | 6.4 | 9.7 | 63.9 | 65 |
| B | 0.2 | 0.5 | 604.6 | 7.3 | 13.5 | 67.7 | 85 |
| C | 1.0 | 0.5 | 605.4 | 7.7 | 14.1 | 70.2 | 95 |

*area % without adhesion loss on the SiNx contaminated part of the silicon wafer's back face

What is claimed is:

1. A process for the production of a silicon solar cell comprising the steps:
   (i) applying an aluminum paste on the back-side of a silicon wafer having a p-type region, an n-type region and a p-n junction, and being provided with a silicon nitride anti-reflective coating on its front-side and contaminated with silicon nitride on its back-side, and
   (ii) firing the surface provided with the aluminum paste, whereby the wafer reaches a peak temperature of 700 to 900° C.,
   wherein the aluminum paste comprises particulate aluminum, magnesium oxide, wherein the magnesium oxide is present in a total proportion corresponding to a total magnesium contribution of 0.1 to 5 wt. %, based on total aluminum paste composition, and an organic vehicle comprising organic solvent(s).

2. The process of claim 1, wherein the aluminum paste comprises one or more glass frits in a total proportion of 0.01 to 5 wt. %, based on total aluminum paste composition.

3. The process of claim 1, wherein the particulate aluminum is present in a proportion of 50 to 80 wt. %, based on total aluminum paste composition.

4. The process of claim 1, wherein the organic vehicle further comprises organic polymer(s) and/or organic additive(s).

5. The process of claim 1, wherein the application of the aluminum paste is performed by printing.

6. The process of claim 1, wherein firing is performed as cofiring together with other front-side and/or back-side metal pastes that have been applied to the silicon wafer to form front-side and/or back-side electrodes thereon during firing.

* * * * *